(12) United States Patent
Tatsumi et al.

(10) Patent No.: US 10,903,146 B2
(45) Date of Patent: Jan. 26, 2021

(54) ELECTRODE CONNECTION STRUCTURE, LEAD FRAME, AND METHOD FOR FORMING ELECTRODE CONNECTION STRUCTURE

(71) Applicants: WASEDA UNIVERSITY, Tokyo (JP); MITSUI HIGH-TEC, INC., Fukuoka (JP)

(72) Inventors: Kohei Tatsumi, Tokyo (JP); Kazutoshi Ueda, Fukuoka (JP); Nobuaki Sato, Fukuoka (JP); Koji Shimizu, Fukuoka (JP)

(73) Assignees: WASEDA UNIVERSITY, Tokyo (JP); MITSUI HIGH-TEC, INC., Fukuoka (JP)

(*) Notice: Subject to any disclaimer, the term of this patent is extended or adjusted under 35 U.S.C. 154(b) by 0 days.

(21) Appl. No.: 16/083,389

(22) PCT Filed: Mar. 7, 2017

(86) PCT No.: PCT/JP2017/008970
§ 371 (c)(1),
(2) Date: Sep. 7, 2018

(87) PCT Pub. No.: WO2017/154893
PCT Pub. Date: Sep. 14, 2017

(65) Prior Publication Data
US 2019/0103341 A1    Apr. 4, 2019

(30) Foreign Application Priority Data
Mar. 10, 2016 (JP) .................. 2016-047040

(51) Int. Cl.
*H01L 23/495* (2006.01)
*H01L 23/50* (2006.01)
(Continued)

(52) U.S. Cl.
CPC .. *H01L 23/49541* (2013.01); *H01L 23/49537* (2013.01); *H01L 23/49548* (2013.01);
(Continued)

(58) Field of Classification Search
CPC ............ H01L 23/49541; H01L 23/50; H01L 23/49548; H01L 2224/4805;
(Continued)

(56) References Cited

U.S. PATENT DOCUMENTS 5,939,779 A * 8/1999 Kim ................... H01L 21/565
257/692
6,075,281 A * 6/2000 Liao .................. H01L 23/4952
257/666

(Continued)

FOREIGN PATENT DOCUMENTS

JP       H06-224262 A    12/1994
JP       2868943 B2      3/1999
(Continued)

OTHER PUBLICATIONS

International Search Report issued in Application No. PCT/JP2017/008970, dated May 23, 2017.

*Primary Examiner* — Feifei Yeung Lopez
(74) *Attorney, Agent, or Firm* — Michael Best & Friedrich LLP

(57) ABSTRACT

[Problem] To provide an electrode connection structure and the like in which a plurality of elongated leads are arranged in parallel and a longitudinal side surface of each lead is connected to an electrode by plating treatment with high quality.
[Solution] An electrode connection structure in which a semiconductor chip 12 electrode and/or a substrate electrode is connected to a plurality of elongated leads 11 of a lead frame 10 by plating. The plurality of elongated leads 11 of
(Continued)

the lead frame 10 are arranged in parallel, and a longitudinal side surface of each lead 11 is connected to the semiconductor chip 12 electrode and/or the substrate electrode by plating. At a connection portion of a first connection surface 13 of the semiconductor chip 12 electrode and/or the substrate electrode, the first connection surface 13 being connected to the leads 11, and a second connection surface 14 in the longitudinal side surface of each lead 11, the second connection surface 14 being connected to the first connection surface 13, a distance between the first connection surface 13 and the second connection surface 14 continuously increases from an edge portion 15 of the second connection surface 14, the edge portion 15 being in contact with the first connection surface 13, toward an outer portion 16 of the second connection surface 14.

6 Claims, 12 Drawing Sheets

(51) Int. Cl.
*H01L 23/498* (2006.01)
*H01L 23/00* (2006.01)

(52) U.S. Cl.
CPC .. *H01L 23/49816* (2013.01); *H01L 23/49838* (2013.01); *H01L 23/50* (2013.01); *H01L 24/10* (2013.01); *H01L 24/75* (2013.01); *H01L 24/81* (2013.01); *H01L 2224/11* (2013.01); *H01L 2224/15* (2013.01); *H01L 2224/45013* (2013.01); *H01L 2224/4805* (2013.01)

(58) Field of Classification Search
CPC ..... H01L 2224/45013; H01L 23/49838; H01L 23/49537
See application file for complete search history.

(56) References Cited

U.S. PATENT DOCUMENTS

| | | | |
|---|---|---|---|
| 6,762,067 B1 * | 7/2004 | Quinones | H01L 23/488 257/E23.023 |
| 2002/0047187 A1 * | 4/2002 | Nakajima | H01L 23/49524 257/666 |
| 2016/0225730 A1 | 8/2016 | Tatsumi | |

FOREIGN PATENT DOCUMENTS

| | | |
|---|---|---|
| JP | 2007-335473 A | 12/2007 |
| JP | 2010-118577 A | 5/2010 |
| WO | WO-2015/053356 A1 | 4/2015 |

* cited by examiner

PHOTOGRAPH OF APPEARANCE

CROSS SECTIONAL SHAPE

PHOTOGRAPH OF CROSS SECTION

ELECTRODE CONNECTION STRUCTURE, LEAD FRAME, AND METHOD FOR FORMING ELECTRODE CONNECTION STRUCTURE

TECHNICAL FIELD

The present invention relates to an electrode connection structure and the like in which an electronic device electrode and/or a substrate electrode is connected to a lead of a lead frame by plating.

BACKGROUND ART

Patent Literatures 1 to 3 disclose techniques for connecting electrodes by plating. Patent Literature 1 (hereinafter, also referred to as "PTL1") discloses a technique of a lead for plating connection with a semiconductor electrode wherein a protrusion, made of the same material or electric conductor, having the height of 5 to 200 µm is provided on a tip of the lead by plating or bending. Patent Literature 1 also discloses a technique that the protrusion of the tip of the lead and an electrode on a semiconductor element are arranged at the same position and contacted and fixed such that electrical conduction is obtained, then immersed in a plating bath or placed during spraying a plating solution, thereby connecting the lead and the electrode on the semiconductor element with a plating metal.

Patent Literature 2 (hereinafter, also referred to as "PTL2") discloses a technique having a configuration in which a plating 4 grows radially around a protrusion 3 between a semiconductor element 1 and a metal plate 2.

Patent Literature 3 (hereinafter, also referred to as "PTL3") discloses a technique that at least a part of a plurality of electrodes, of an electric circuit, to be electrically connected is directly or indirectly brought into contact, and connected by plating between the electrodes in a state where a plating solution is circulated around the contact portion.

CITATION LIST

Patent Literature

PTL 1: JP 2868943 B2
PTL 2: JP 2007-335473 A1
PTL 3: WO 2015/053356 A1

SUMMARY OF INVENTION

Technical Problem

However, the technique disclosed in Patent Literature 1 is such that the protrusion is provided at the tip of the lead and connected to the electrode by plating, so that it is not applicable to a case where a plurality of elongated leads are arranged in parallel and a longitudinal side surface of each lead is connected to the electrode by plating.

The technique disclosed in Patent Literature 2 is a technique of performing plating around the protrusion between the semiconductor element and the metal plate. However, in a plating region where the semiconductor element and the metal plate are opposed to each other, a region where the semiconductor element and the metal plate are parallel is wide. Such a region may allow variation in plating speed to occur, thereby generating voids. Even if plating is performed only in a region where the semiconductor element and the metal plate are not parallel (i.e., only the protrusion), the plating is insufficient and thermal conductivity and the like are poor, so that it is not possible to make a practical connection.

The technique disclosed in Patent Literature 3 is a technique of plating a side surface of a copper wire and a copper plate, but it plates only the periphery of the contact portion between an arc portion of the copper wire side surface and the copper plate. This causes a problem that thermal conductivity and the like are lowered, although generation of voids and the like can be prevented.

The present invention provides an electrode connection structure and the like for connecting a longitudinal side surface of a lead and an electrode by plating electrode, the lead including a plurality of elongated leads that are arranged in parallel.

Solution to Problem

An electrode connection structure according to the present invention is such an electrode connection structure in which an electronic device electrode and/or a substrate electrode is connected to a lead of a lead frame by plating, wherein a plurality of elongated leads in the lead frame are arranged in parallel, and a longitudinal side surface of each lead is connected to the electronic device electrode and/or the substrate electrode by plating, and at a first connection portion of a first connection surface of the electronic device electrode and/or the substrate electrode, the first connection surface being connected to the leads, and a second connection surface in the longitudinal side surface of each lead, the second connection surface being connected to the first connection surface, a first distance between the first connection surface and the second connection surface continuously increases from an edge portion of the second connection surface, the edge portion being in contact with the first connection surface, toward an outer portion of the second connection surface.

Thus, in the electrode connection structure according to the present invention, when the electronic device electrode and/or the substrate electrode is connected, by plating, to the lead frame in which the plurality of elongated leads are arranged in parallel, on the longitudinal side surface of each lead, the first distance between the first connection surface and the second connection surface continuously increases, at the first connection portion of the first connection surface of the electronic device electrode and/or the substrate electrode and the second connection surface in the longitudinal side surface of each lead, the second connection surface being connected to the first connection surface, from the edge portion of the second connection surface, the edge portion being in contact with the first connection surface, toward the outer portion of the second connection surface, so that it is possible to sufficiently circulate a plating solution between the electronic device electrode and/or the substrate electrode and the longitudinal side surface of each lead, thereby resulting in an advantageous effect that it is possible to realize a high-quality plated connection without generating voids or the like.

Further, it is possible to perform the plating treatment over a wide range of an opposing region that extends from the edge portion of the second connection surface, the edge portion being in contact with the first connection surface, to the outer portion of the second connection surface, thereby resulting in an advantageous effect that it is possible to achieve a connection with excellent thermal conductivity.

The electrode connection structure according to the present invention is such that each lead is reduced in thickness from the edge portion of the second connection surface toward the outer portion of the second connection surface.

Thus, in the electrode connection structure according to the present invention, the longitudinal side surface of each lead is reduced in thickness from the edge portion of the second connection surface toward the outer portion of the second connection surface, so that it is possible to sufficiently circulate a plating solution between the electronic device electrode and/or the substrate electrode and the longitudinal side surface of each lead, thereby resulting in an advantageous effect that it is possible to realize a high-quality plated connection without generating voids or the like.

The electrode connection structure according to the present invention is such that the edge portion is formed at a center portion of the second connection surface in a longitudinal direction.

Thus, in the electrode connection structure according to the present invention, the edge portion is formed at the center portion of the second connection surface in a longitudinal direction, so that it is possible to sufficiently and evenly circulate a plating solution over a large area from the edge portion toward the outer portion of the second connection surface, thereby resulting in an advantageous effect that it is possible to realize a high-quality plated connection.

The electrode connection structure according to the present invention is such that the edge portion includes a plurality of transverse edge portions that are formed at a predetermined interval in a transverse direction of the second connection surface, and a transverse concave groove-like gap is formed between each pair of adjacent transverse edge portions, the transverse gap penetrating in a transverse direction of the second connection surface.

Thus, in the electrode connection structure according to the present invention, the edge portion includes the plurality of transverse edge portions that are formed at the predetermined interval in the transverse direction of the second connection surface, and the transverse concave groove-like gap is formed between each pair of adjacent transverse edge portions, the transverse gap penetrating in the transverse direction of the second connection surface, so that it is possible to perform the plating treatment in a state where a plating solution is sufficiently circulated around the edge portion, thereby resulting in an advantageous effect that it is possible to realize a high-quality plated connection. Further, forming the transverse concave groove-like gap makes it possible to disperse the stress applied in a longitudinal direction, thereby resulting in an advantageous effect that it is possible to prevent breakage and the like of the leads.

The electrode connection structure according to the present invention is such that a longitudinal concave groove-like gap that is continuous or discontinuous in a longitudinal direction of the second connection surface is formed.

Thus, in the electrode connection structure according to the present invention, the longitudinal concave groove-like gap that is continuous or discontinuous in the longitudinal direction of the second connection surface is formed, so that it is possible to disperse the stress applied in a transverse direction, thereby resulting in an advantageous effect that it is possible to more reliably prevent breakage and the like of the leads.

The electrode connection structure according to the present invention is such that at a second connection portion of a third connection surface on a back surface side of the second connection surface and a fourth connection surface of the electronic device electrode and/or the substrate electrode, the fourth connection surface being connected to the third connection surface, a second distance between the fourth connection surface and the third connection surface continuously increases from a second edge portion of the third connection surface, the second edge portion being in contact with the fourth connection surface, toward a second outer portion of the third connection surface.

Thus, in the electrode connection structure according to the present invention, at the second connection portion of the third connection surface on the back surface side of the second connection surface and the fourth connection surface of the electronic device electrode and/or the substrate electrode, the fourth connection surface being connected to the third connection surface, the second distance between the fourth connection surface and the third connection surface continuously increases from a second edge portion of the third connection surface, the second edge portion being in contact with the fourth connection surface, toward the second outer portion of the third connection surface, thereby resulting in an advantageous effect that it is possible to form the electronic device electrode and/or the substrate electrode and the lead frame in multiple layers with a high-quality plated connection.

The electrode connection structure according to the present invention is such that the connection by plating is made by plating with a metal or an alloy having a melting point of 700° C. or higher, and the metal or the alloy is preferably nickel (Ni) or a nickel (Ni) alloy.

Thus, in the electrode connection structure according to the present invention, the connection by plating is made by plating with the metal or the alloy having the melting point of 700° C. or higher, and the metal or the alloy is preferably nickel (Ni) or the nickel (Ni) alloy, so that the plating treatment is performed in a plating solution at 100° C. or lower, thereby resulting in an advantageous effect that it is possible to reduce damage due to stress and heat at the time of connection. Further, performing the plating treatment with a high-melting point metal or alloy results in an advantageous effect that it is possible to ensure accurate operation even in a high temperature state.

The electrode connection structure according to the present invention is such that an angle between the electronic device electrode and/or the substrate electrode and the longitudinal side surface of each lead at the edge portion of each lead is 3 to 15 degrees.

Thus, in the electrode connection structure according to the present invention, the angle between the electronic device electrode and/or the substrate electrode and the longitudinal side surface of each lead at the edge portion of each lead is 3 to 15 degrees, so that it is possible to form the electrode with a large width in a short plating time, thereby resulting in an advantageous effect that it is possible to improve the manufacturing efficiency.

A method for forming the electrode connection structure according to the present invention is such that the edge portion is formed by press working or etching processing.

Thus, in the method for forming the electrode connection structure according to the present invention, the edge portion is formed by press working or etching processing, thereby resulting in an advantageous effect that it is possible to efficiently form a high-quality electrode connection structure in a simplified manufacturing process.

A method for forming an electrode connection structure in which an electronic device electrode and/or a substrate electrode is connected to a lead of a lead frame is such that the lead frame includes a plurality of elongated leads arranged in parallel and an edge portion on a longitudinal side surface of each lead, and the method includes applying ultrasonic vibration in a state where the electronic device electrode and/or the substrate electrode is in contact with the edge portion of each lead to buckle a tip of the edge portion, whereby the electronic device electrode and/or the substrate electrode is ultrasonically joined to each lead.

Thus, in the electrode connection structure forming method according to the present invention, it is provided with the method for forming the electrode connection structure in which the electronic device electrode and/or the substrate electrode is connected to the lead of the lead frame is such that the lead frame includes the plurality of elongated leads arranged in parallel and the edge portion on the longitudinal side surface of each lead, and the method includes applying ultrasonic vibration in the state where the electronic device electrode and/or the substrate electrode is in contact with the edge portion of each lead to buckle the tip of the edge portion, whereby the electronic device electrode and/or the substrate electrode is ultrasonically joined to each lead, thereby resulting in an advantageous effect that it is possible to join the lead and the electrode with high bonding property using the edge portion.

The electrode connection structure forming method according to the present invention is such that a plating joining process is performed in a state where the electronic device electrode and/or the substrate electrode is temporarily joined to each lead of the lead frame by the ultrasonic joining.

Thus, in the electrode connection structure forming method according to the present invention, the plating joining process is performed in the state where the electronic device electrode and/or the substrate electrode is temporarily joined to each lead of the lead frame by the ultrasonic joining, thereby resulting in an advantageous effect that it is possible to easily perform the positioning of the plating joining and it is possible to reduce residual voids after plating in a non-contact region of a tip of the edge portion. Further, it is not needed to use an auxiliary jig when the positioning of the plating joining is performed, thereby resulting in an advantageous effect that it is possible to omit the step of attaching and detaching the jig and to realize a simple and low-cost manufacturing method.

The electrode connection structure forming method according to the present invention is such that an angle between the edge portion of each lead and the electronic device electrode and/or the substrate electrode is 3 to 15 degrees.

Thus, in the electrode connection structure forming method according to the present invention, the angle between the edge portion of each lead and the electronic device electrode and/or the substrate electrode is 3 to 15 degrees, so that it is possible to form the electrode with a large width in a short plating time, thereby resulting in an advantageous effect that it is possible to improve the manufacturing efficiency.

The electrode connection structure forming method according to the present invention is such that a buckling width of a tip of the edge portion is 1 to 50 µm.

Thus, in the electrode connection structure forming method according to the present invention, the buckling width of the tip of the edge portion is 1 to 50 µm, so that the tip of the edge portion buckles at the time of joining, thereby resulting in an advantageous effect that it is possible to prevent damage to a joining destination electrode at the tip of the edge portion while realizing the joining at a minute surface.

The electrode connection structure forming method according to the present invention is such that a frequency of the ultrasonic vibration is 15 to 150 kHz.

Thus, in the electrode connection structure forming method according to the present invention, the frequency of the ultrasonic vibration is 15 to 150 kHz, so that it is possible to efficiently propagate energy to the joined portion while reliably destroying unnecessary oxide film and the like on a joining surface, thereby resulting in an advantageous effect that it is possible to increase energy efficiency.

DESCRIPTION OF EMBODIMENTS

Figure 1A:
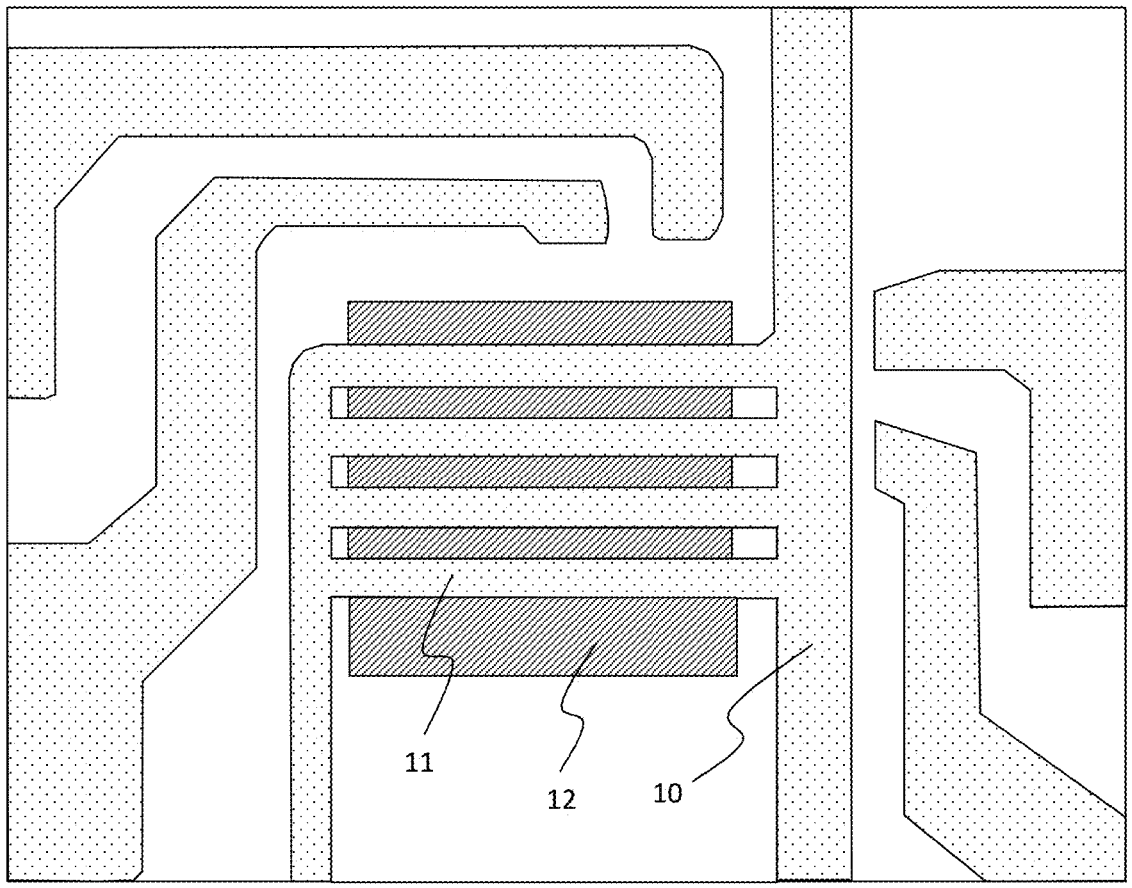
FIGS. 1A and 1B are diagrams showing a connection structure of a lead frame and a semiconductor chip used in an electrode connection structure according to a first embodiment.

Embodiments of the present invention will be described below. The same reference numerals are given to the same elements throughout the embodiments. Although each of the embodiments will describe an electrode connection structure and a method for forming the electrode connection structure in a case where a semiconductor chip is used as an example of an electronic device, it is possible to apply the electrode connection structure to that of such an electronic device as a sensor, Micro Electro Mechanical Systems (MEMS), a light emitting diode (LED), a battery, or the like other than the semiconductor chip.

First Embodiment of the Present Invention

Figure 1B:
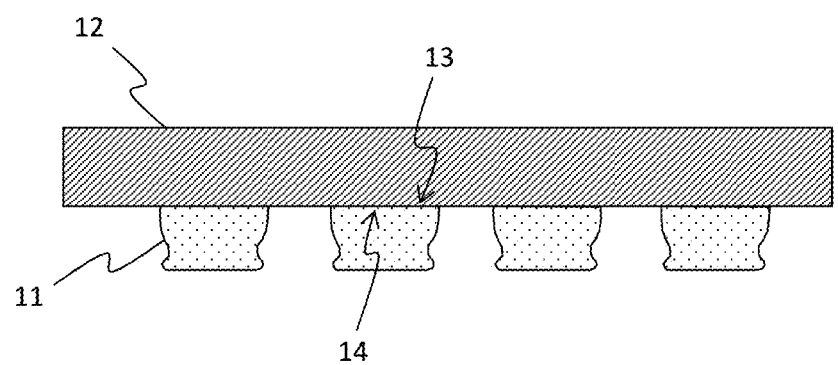

An electrode connection structure according to the present embodiment will be described with reference to FIGS. 1A to 3B. FIGS. 1A and 1B are diagrams showing a connection structure of a lead frame and a semiconductor chip used in the electrode connection structure according to the present embodiment. FIG. 1A is a bottom view in a case where a semiconductor chip and a lead frame are connected to each other, and FIG. 1B is a sectional side view in the case where the semiconductor chip and the lead frame are connected to each other. As shown in FIGS. 1A and 1B, the electrode connection structure according to the present embodiment is such that a lead frame 10 has a plurality of elongated leads 11 arranged in parallel like a ladder and a longitudinal side surface of each lead 11 in the lead frame 10 is connected to an electrode of a semiconductor chip 12 by plating. An electrode surface of the semiconductor chip 12, which is connected in direct contact with the lead frame 10, is referred to as a first connection surface 13, and the longitudinal side surface of the lead 11, which is in contact with the first connection surface 13, is referred to as a second connection surface 14. The semiconductor chip 12 and the lead frame 10 are electrically connected to each other by joining the first connection surface 13 and the second connection surface 14 together by plating between both connection surfaces 13 and 14.

Figure 2A:
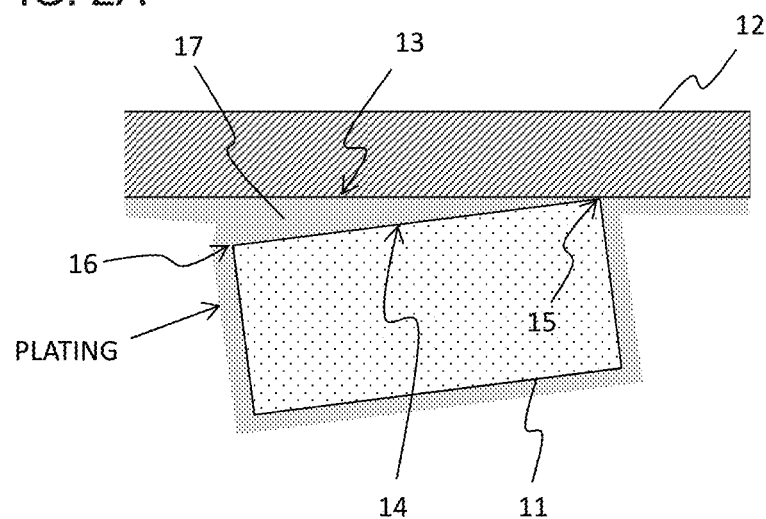
FIGS. 2A and 2B are first enlarged views in a case where a first connection surface and a second connection surface in the electrode connection structure according to the first embodiment are plated.
Figure 2B:
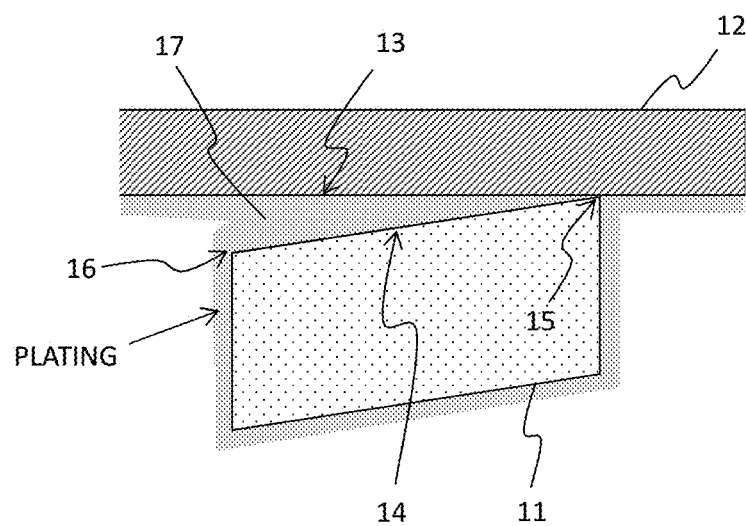

FIGS. 2A and 2B are first enlarged views in a case where the first connection surface and the second connection surface in the electrode connection structure according to the present embodiment are plated. When the first connection surface 13 and the second connection surface 14 are plated in a state where both connection surfaces 13 and 14 are in close contact with each other on a plane-to-plane basis, there may be a case where a plating solution is not sufficiently circulated between the first connection surface 13 and the second connection surface 14 and a defect such as a void is formed, which leads to deterioration of quality. Therefore, in the present embodiment, for the purpose of sufficiently circulating the plating solution between the first connection surface 13 and the second connection surface 14, an edge portion 15 is provided on the second connection surface 14, and a gap 16 is formed such that a distance between the first connection surface 13 and the second connection surface 14 increases continuously, in a state where the edge portion 15 is in contact with the first connection surface 13, from the edge portion 15 toward an outer portion 16 of the second connection surface 14 (an end of the second connection surface). With the formation of the gap 16, it is possible to sufficiently circulate the plating solution between the first connection surface 13 and the second connection surface 14, and it is possible to fill the gap 17 gradually from the periphery of the edge portion 15 by plating, thereby enabling a wide area of the gap 17 to be filled with plating.

FIG. 2A shows a case where a cross section of the lead 11 is a rectangle, and FIG. 2B shows a case where the cross section of the lead 11 is a parallelogram. Other than those, the cross-sectional shape of the lead 11 may be in the shape of a polygon such as a square, a rhombus, or a trapezoid. In terms of manufacturing, it is preferable to be rectangular as shown in FIG. 2A or square in shape to reduce time and effort of the work. In a case where the edge portion 15 is formed on a part of an end of the second connection surface 14 as shown in FIGS. 2A and 2B, the gap 17 is formed such that the distance between the respective connection surfaces continuously increases toward the outer portion 16 except for a portion where the edge portion 15 is formed.

Figure 3A:
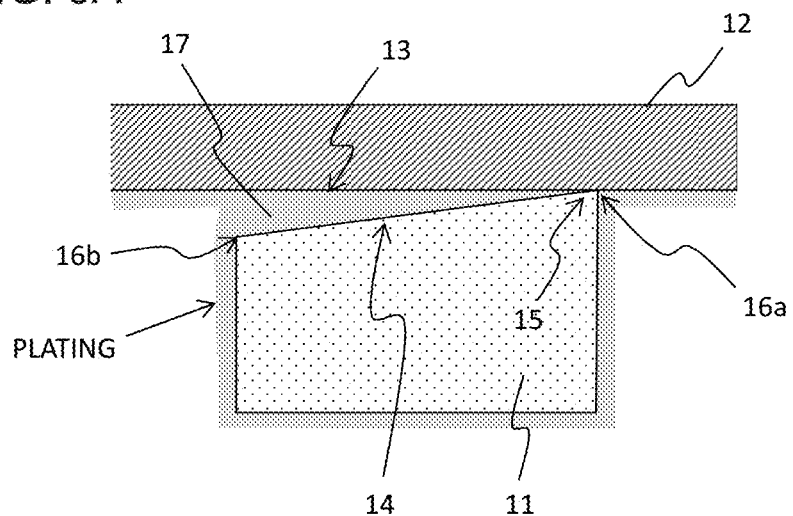
FIGS. 3A and 3B are second enlarged views in the case where the first connection surface and the second connection surface in the electrode connection structure according to the first embodiment are plated.
Figure 3B:
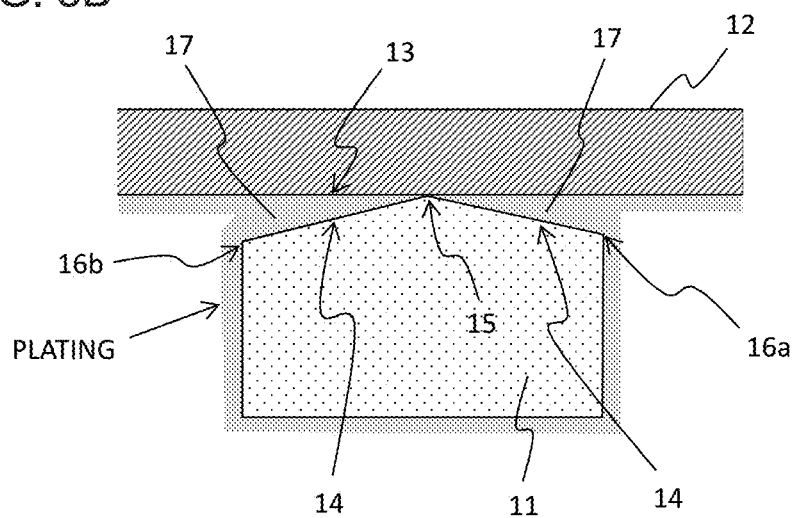

FIGS. 3A and 3B are second enlarged views in the case where the first connection surface and the second connection surface in the electrode connection structure according to the present embodiment are plated. FIG. 3A shows a structural example in which the edge portion 15 is provided at an outer portion 16a of one end of the second connection surface 14 and the lead 11 is reduced in thickness toward an outer portion 16b on the other end of the second connection surface 14, resulting in that the gap 17 is formed such that the distance between the first connection surface 13 and the second connection surface 14 continuously increases from the edge portion 15 toward the outer portion 16b. This reduction in thickness can be performed not only by press working but also by etching processing or cutting working.

FIG. 3B shows another structural example in which the edge portion 15 is provided at a center portion on the second connection surface 14 in a longitudinal direction and the lead 11 is reduced in thickness toward the outer portions 16a and 16b at both ends, resulting in that the gap 17 is formed such that the distance between the first connection surface 13 and the second connection surface 14 continuously increases from the edge portion 15 toward the outer portions 16a and 16b. This reduction in thickness can be performed not only by press working but also by etching processing or cutting working.

As shown in FIGS. 3A and 3B, the thickness reduction of the second connection surface 14 of the lead 11 from the edge portion 15 toward the outer portion 16 of the lead 11 can make the gap 17. By allowing the plating solution to sufficiently flow through the gap 17, it is possible to connect the first connection surface 13 and the second connection surface 14 by plating without causing defects such as voids, and it is possible to widely fill the region, where the connection surface 13 and the second connection surface 14 are opposed, with plating.

In the above, the connection structure between the lead frame 10 and the electrode of the semiconductor chip 11 has been described. However, the same electrode connection structure technology can be applied to the connection between the lead frame 10 and a substrate electrode. Further, the distance between the first connection surface 13 and the second connection surface 14 that continuously increases from the edge portion 15 toward the outer portion 16 of the lead 11 can be arbitrarily set according to the rate of plating progression. For example, it is set to such a distance (=edge angle) that the gap 17 is gradually filled with plating from the edge portion 15.

Thus, in the electrode connection structure according to the present embodiment as shown in FIGS. 2A to 3B, the edge portion 15 is provided on the longitudinal side surface of the lead 11, and the gap 17 is formed such that the distance between the first connection surface 13 and the second connection surface 14 continuously increases from the edge portion 15 toward the outer portion 16 of the lead 11, so that it is possible to sufficiently circulate the plating solution between the first connection surface 13 and the second connection surface 14, thereby allowing for high-quality plated connection without causing detects such as voids, and it is possible to widely fill the region, where the connection surface 13 and the second connection surface 14 are opposed, with plating.

Further, since the region, where the first connection surface 13 and the second connection surface 14 are opposed, is widely filled with plating, it is possible to enhance thermal conductivity.

Second Embodiment of the Present Invention

An electrode connection structure according to the present embodiment will be described with reference to FIGS. 4A to 7B. The electrode connection structure according to the present embodiment is such that a plurality of transverse edge portions 15 are formed at a predetermined interval in a transverse direction of the second connection surface 14 on the longitudinal side surface of the lead 11. Description overlapping with the first embodiment in the present embodiment will be omitted.

Figure 4:
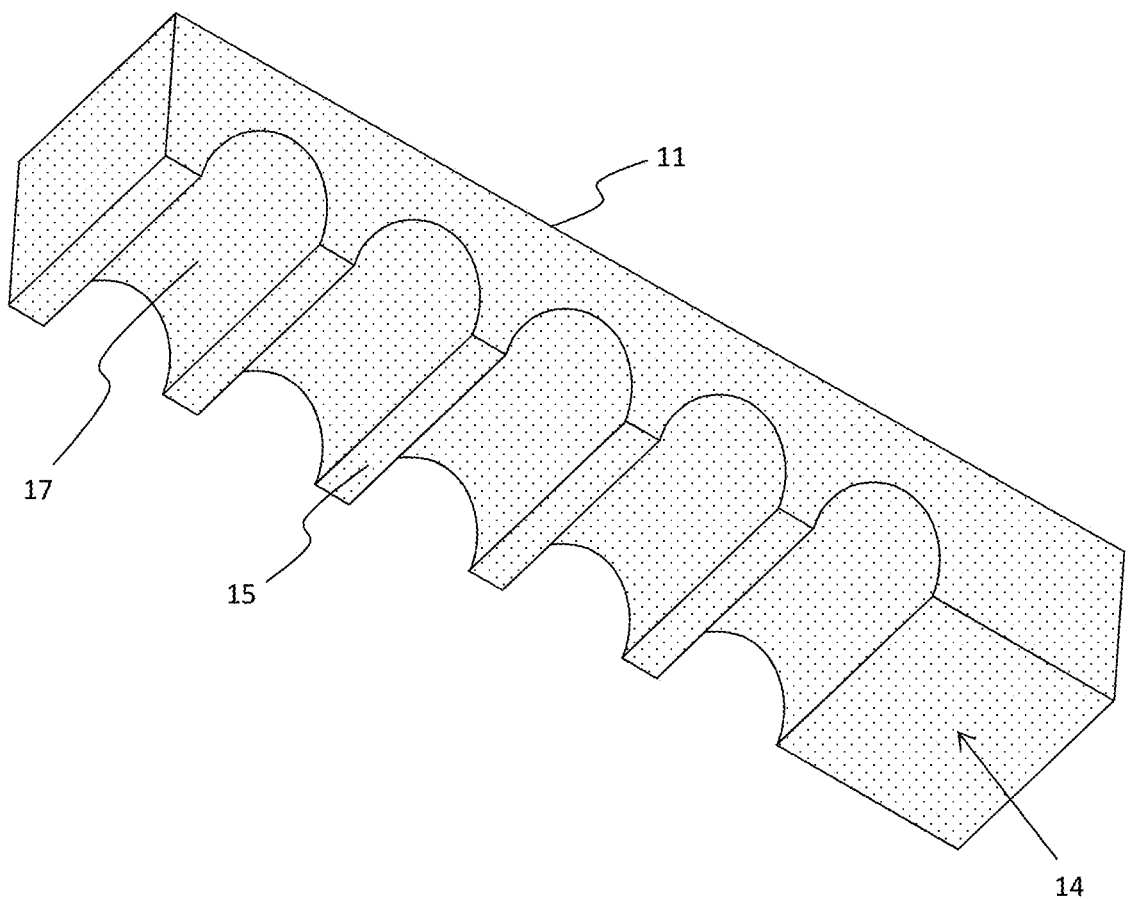
FIG. 4 is a perspective view showing a shape of a lead in an electrode connection structure according to a second embodiment.
Figure 5A:
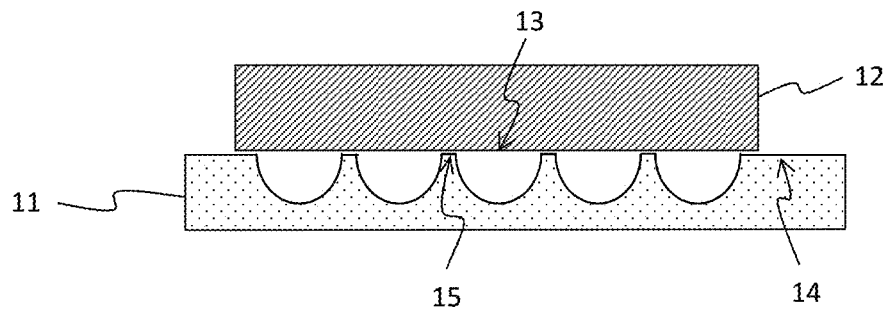
FIGS. 5A to 5C are diagrams showing a connection structure of a lead frame and a semiconductor chip in the electrode connection structure according to the second embodiment.
Figure 5B:
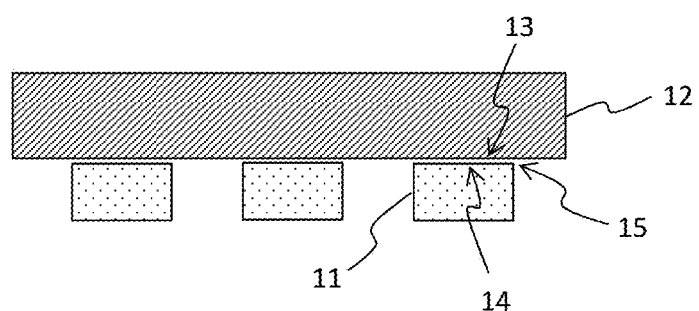
Figure 5C:
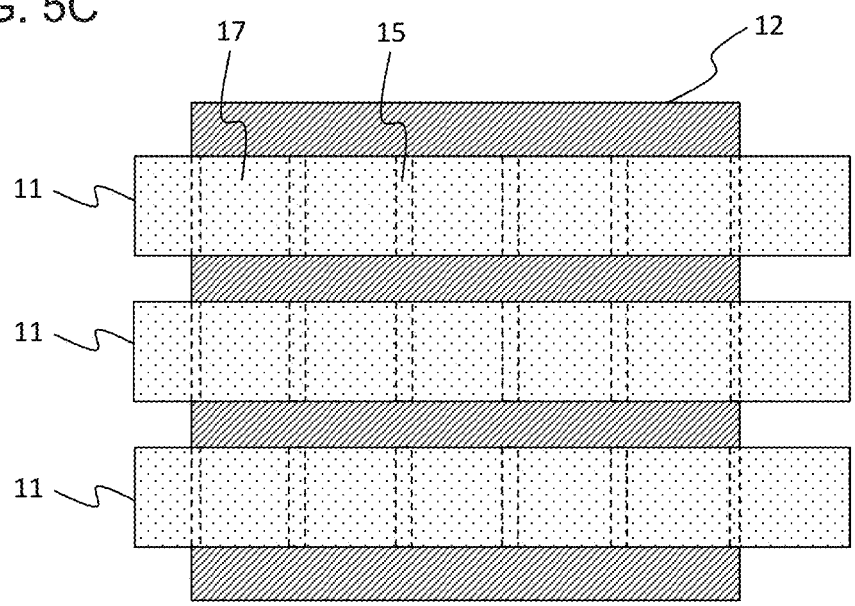

FIG. 4 is a perspective view showing a shape of a lead in the electrode connection structure according to the present embodiment, and FIGS. 5A to 5C are diagrams showing a connection structure of a lead frame and a semiconductor chip in the electrode connection structure according to the present embodiment. As shown in FIG. 4, a plurality of narrow transverse edge portions 15 are formed on the second connection surface 14 of the lead 11 in a transverse direction thereof, and a transverse concave groove-like gap 17 is formed between each pair of adjacent transverse edge portions 15, wherein the transverse gap 17 penetrates in the transverse direction of the second connection surface 14.

As shown in FIGS. 5A to 5C, plating treatment is performed in a state where the edge portion 15 of the lead 11 is in contact with the semiconductor chip 12 (or a substrate electrode). The lead 11 has the transverse concave groove-like gap 17 formed between each pair of adjacent transverse edge portions 15 as shown in FIG. 4, so that a plating solution is sufficiently circulated around the edge portions 15 as in the first embodiment mentioned above, thereby resulting in that it is possible to perform high-quality plating treatment around the edge portions 15. Further, forming the plurality of transverse gaps 17 between each pair of adjacent transverse edge portions 15 makes it possible to disperse the stress applied in the longitudinal direction and prevent breakage and the like of the lead 11.

Figure 6A:
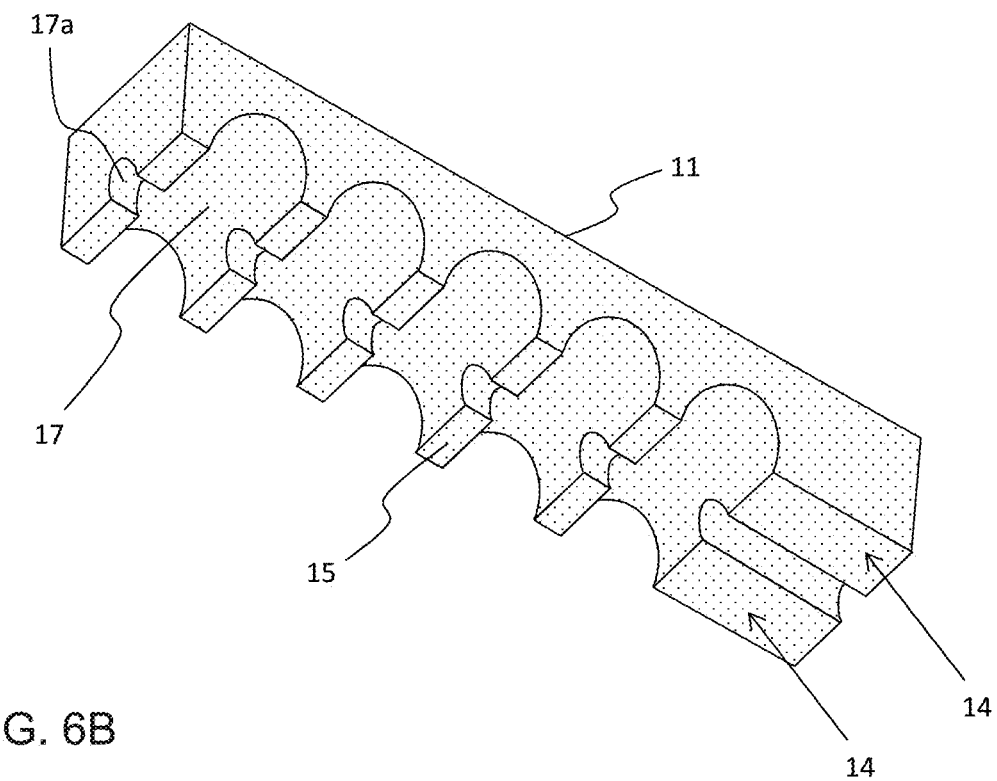
FIGS. 6A and 6B are diagrams showing configurations when the shape of the lead 11 shown in FIG. 4 is improved.
Figure 6B:
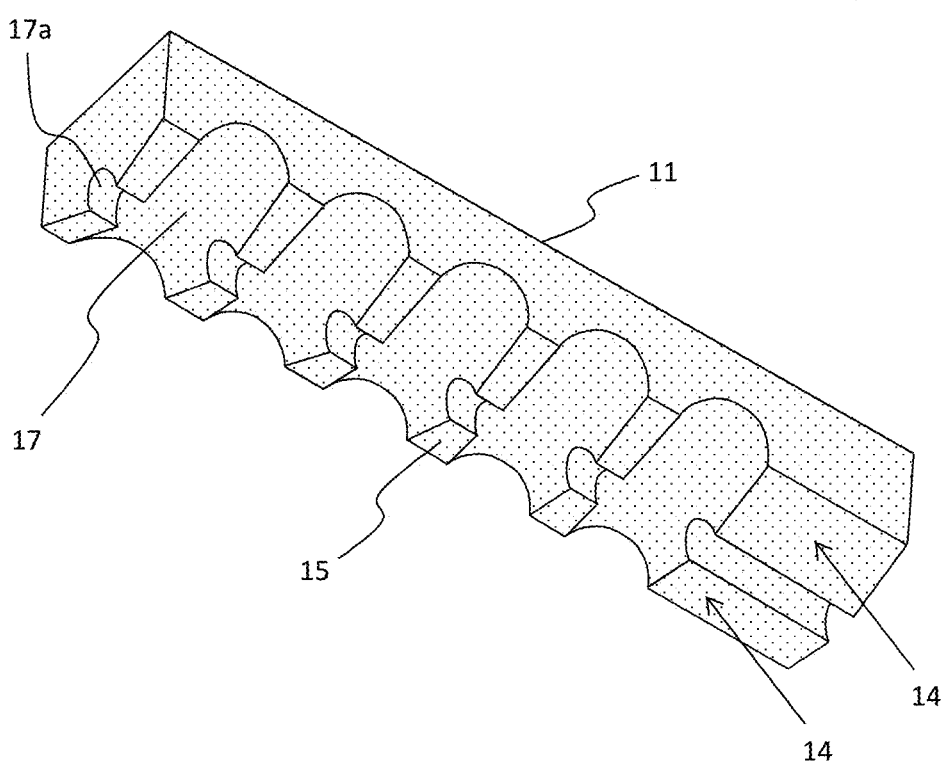

A further improvement of the shape of the lead 11 shown in FIG. 4 is shown in FIGS. 6A and 6B. FIG. 6A shows such a structure that a longitudinal concave groove-like gap 17a that is discontinuous in a longitudinal direction is further formed in the shape of the lead 11 shown in FIG. 4, and FIG. 6B shows such a structure that the edge portions 15 formed in the transverse direction of the lead 11 is further formed into a mountain shape. Forming notches in parts of the edge portions 15 to form the discontinuous longitudinal concave groove-like gap 17a in the longitudinal direction as shown in FIG. 6A makes it possible to disperse the stress applied in the transverse direction and to prevent breakage and the like of the lead 11.

In the case of the lead 11 shown in FIG. 3B in the first embodiment, forming, at the edge portion 15, a concave groove-like gap that is continuous in a longitudinal direction of the edge portion 15 makes it possible to disperse the stress applied in the transverse direction and to prevent breakage and the like of the lead 11 as in the case of FIG. 6A.

FIG. 6B shows such a structure that the edge portion 15 in FIG. 6A is processed to have a mountain shape when viewed from the longitudinal direction of the lead 11. This processing makes it possible to disperse the stress applied to the lead 11 and to prevent breakage and the like of the lead 11 as described above, and also makes it possible to more effectively circulate the plating solution to perform extremely high-quality plating treatment. In FIG. 6B, the discontinuous longitudinal concave groove-like gap 17a in the longitudinal direction may be omitted.

Figure 7A:
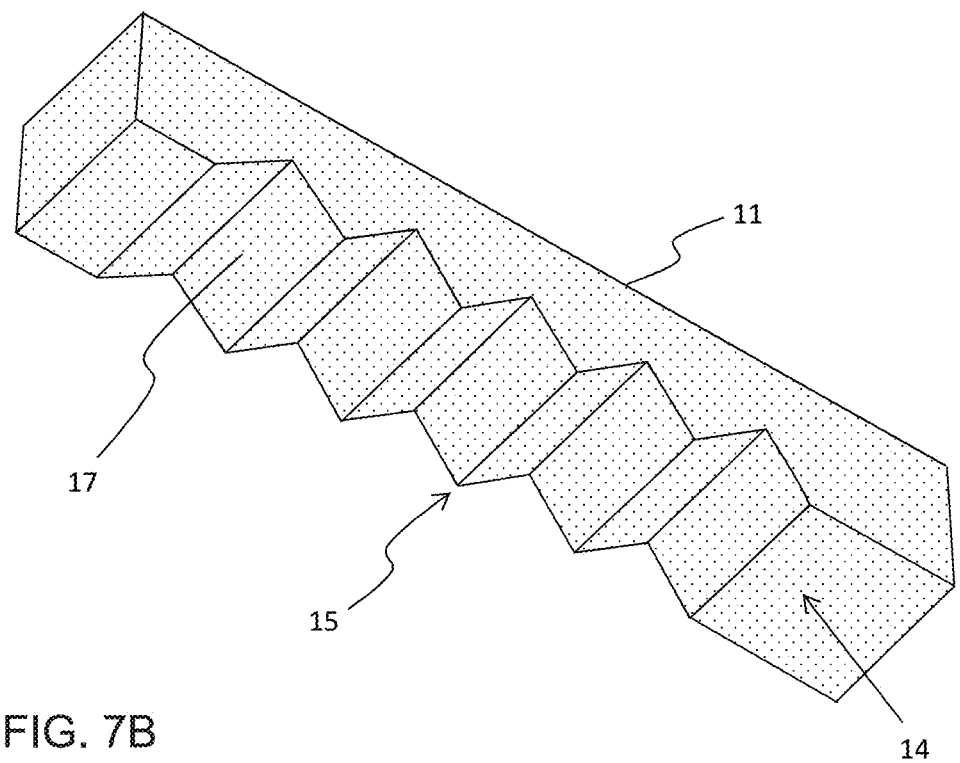
FIGS. 7A and 7B are diagrams showing modified examples of the lead shown in FIGS. 6A and 6B.
Figure 7B:
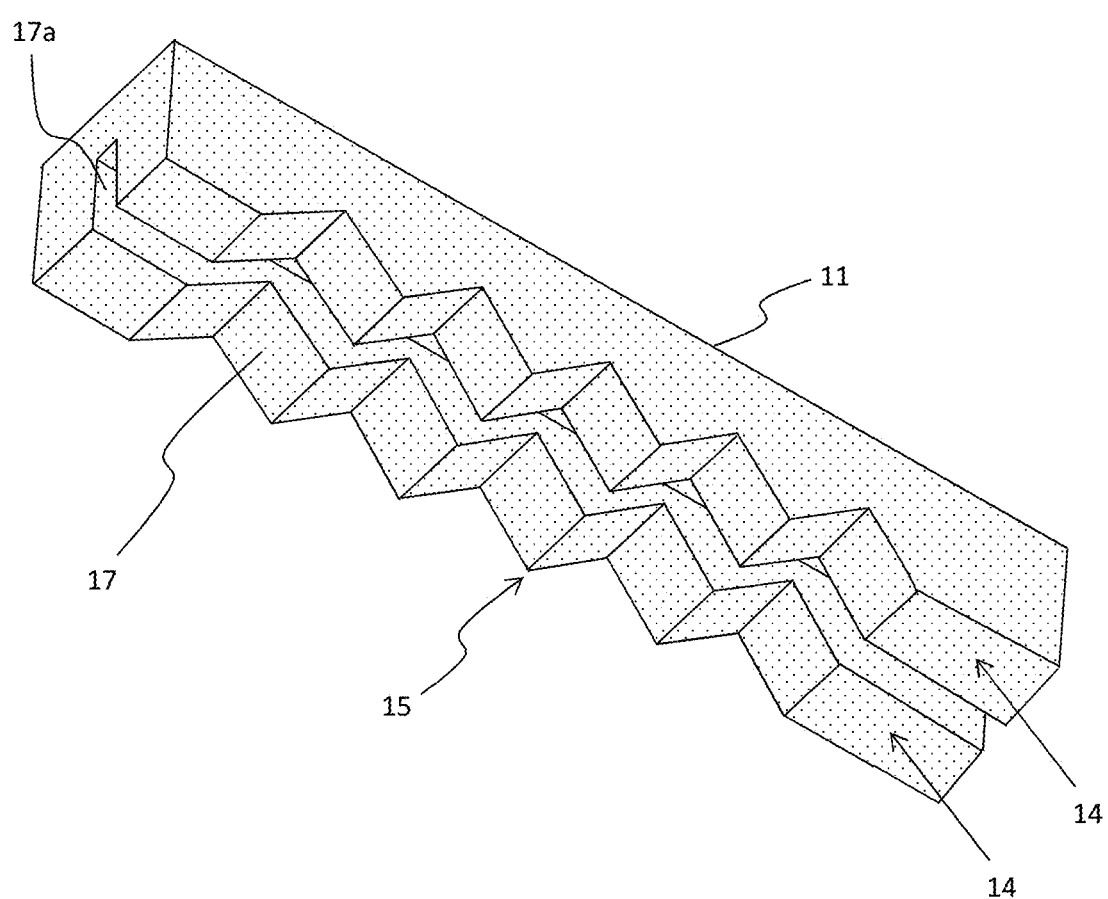

FIGS. 7A and 7B show modified examples of the lead shown in FIGS. 6A and 6B. In the case of FIGS. 7A and 7B, a plurality of edge portions 15 that are narrower than those in the case of FIGS. 6A and 6B are formed in the transverse direction. Further, the transverse concave groove-like gap 17 penetrating in the transverse direction is not in the shape of an R but in the shape of a concave groove having an acute angle (see FIG. 7A). Even in such a shape of the lead 11 as well, forming notches in parts of the edge portions 15 to form continuous longitudinal concave groove-like gap 17a in the longitudinal direction as in the case of FIG. 6A makes it possible to disperse the stress applied in the transverse direction and to prevent breakage and the like of the lead 11 (see FIG. 7B). Furthermore, processing the edge portion 15 to have a mountain shape when viewed from the longitudinal direction of the lead 11 as in the case of FIG. 6B makes it possible to more effectively circulate the plating solution to perform extremely high-quality plating treatment.

Third Embodiment of the Present Invention

An electrode connection structure according to the present embodiment will be described with reference to FIGS. 8 to 9B. The electrode connection structure according to the present embodiment is such that at a connection portion of a third connection surface on a back surface side of the second connection surface on the longitudinal side surface of the lead 11 and a fourth connection surface of a semiconductor chip 12A electrode surface (or may be a substrate electrode surface) connected to the third connection surface, a distance between the fourth connection surface and the third connection surface continuously increases from an edge portion of the third connection surface, which is in contact with the fourth connection surface, toward an outer portion of the third connection surface. Description overlapping with the first and second embodiments in the present embodiment will be omitted.

Figure 8:
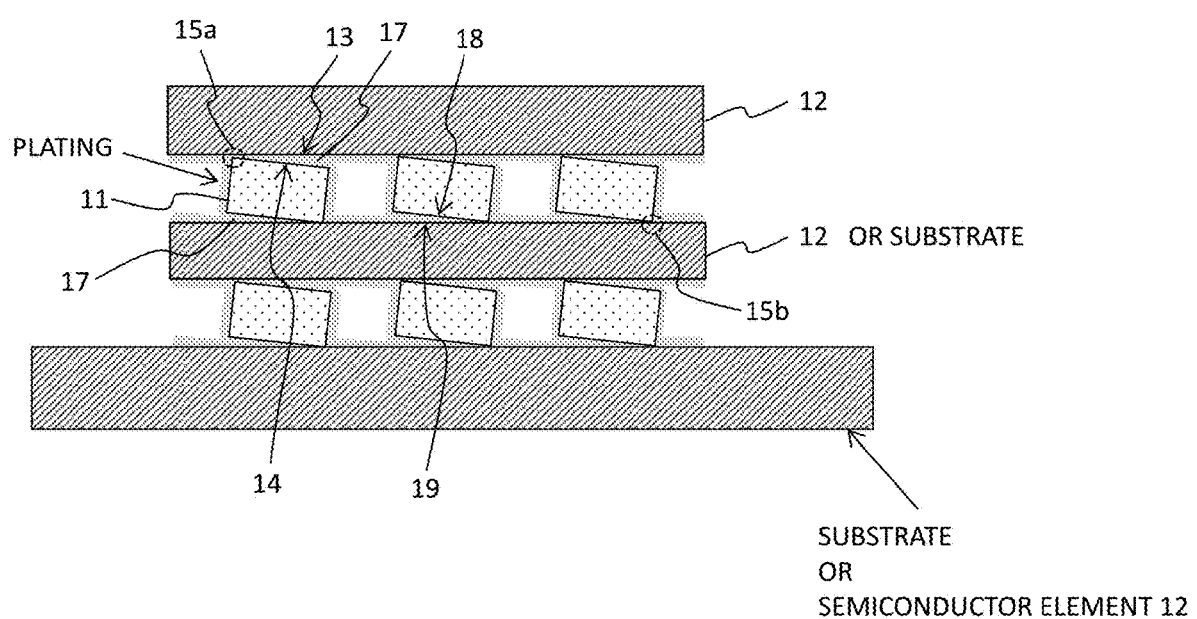
FIG. 8 is a front view showing an electrode connection structure according to a third embodiment.

FIG. 8 is a front view showing the electrode connection structure according to the present embodiment. As shown in FIG. 8, an edge portion 15a is provided on the second connection surface 14 that is an upper surface side of the lead 11, and an edge portion 15b is provided on the third connection surface 18 that is a lower surface side of the lead 11. With respect to plating treatment between the first connection surface 13 and the second connection surface 14, high-quality plated connection can be made as explained in each embodiment described above. Similarly, the connection between the third connection surface 18 and the fourth connection surface 19 that is the semiconductor chip 12A electrode surface (or the substrate electrode surface) connected to the third connection surface 18 also allows for high-quality plated connection.

That is, a gap 17 is formed such that a distance between the fourth connection surface 19 and the third connection surface 18 increases continuously, in a state where the edge portion 15b of the third connection surface 18 is in contact with the fourth connection surface 19, from the edge portion 15b toward an outer portion 16 of the third connection surface 18, so that a plating solution can be sufficiently circulated in the gap 17, thereby allowing for high-quality plated connection without defects such as voids.

Thus, performing the above plating connection with the semiconductor chip 12 on both front and back surfaces in the longitudinal side surface of the lead 11 makes it possible to stack the semiconductor chip 12 in multiple layers, thereby resulting in that it is possible to realize a high-quality plated connection and to remarkably improve work efficiency by simplifying stacking process of the semiconductor chip 12.

Figure 9A:
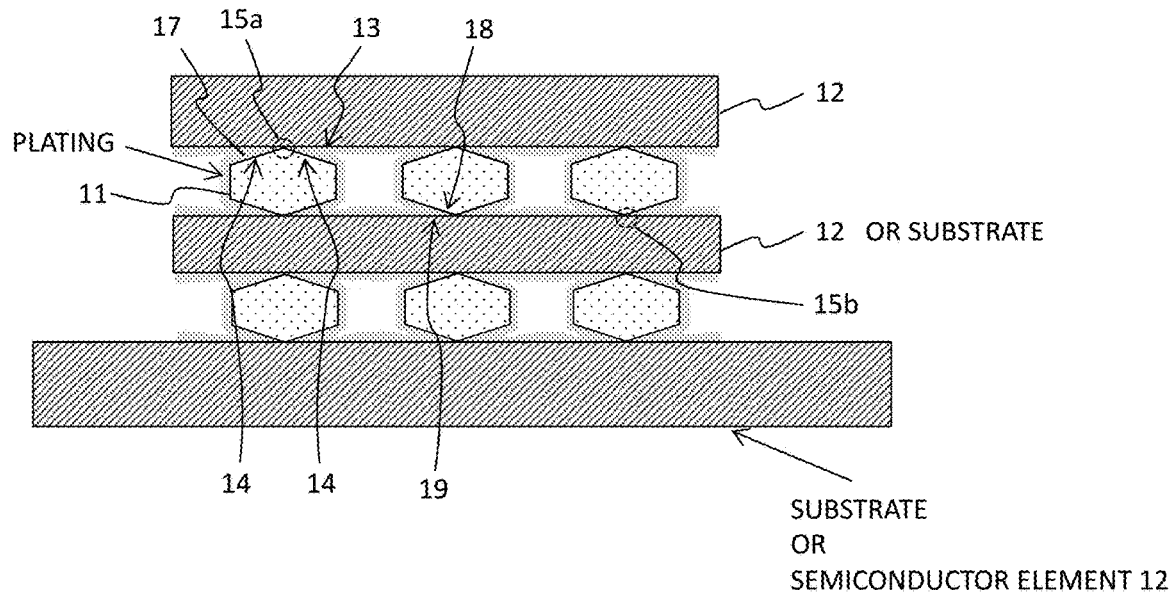
FIGS. 9A and 9B are views showing application examples of the electrode connection structure as shown in FIG. 8.
Figure 9B:
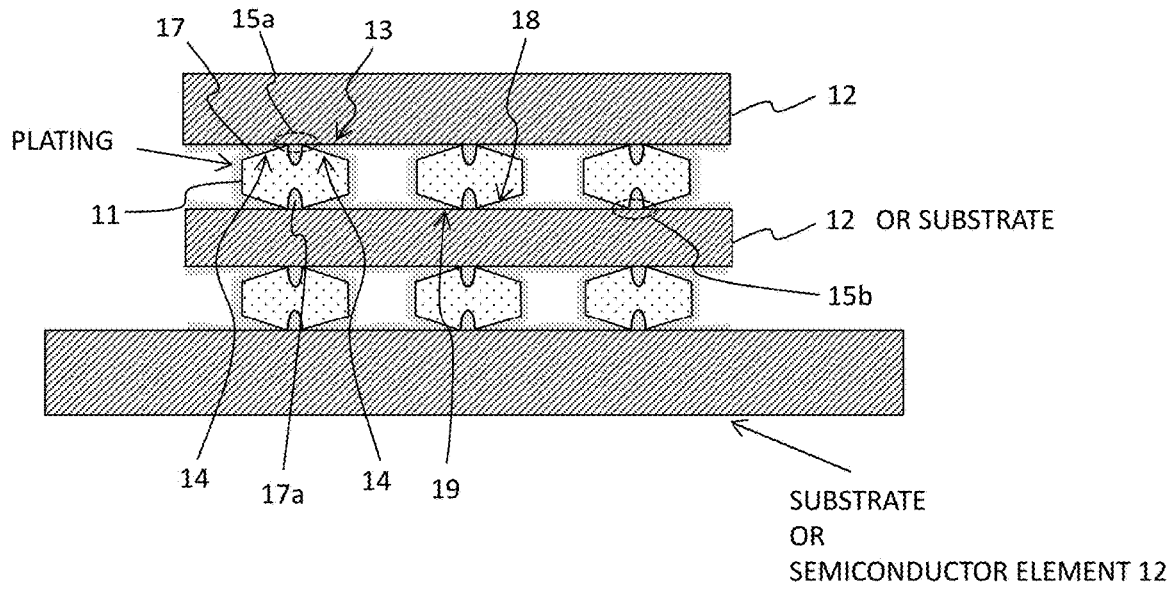

In the electrode connection structure according to the present embodiment, it is possible to use the lead 11 explained in each embodiment described above, as shown in FIGS. 9A and 9B. For example, FIG. 9A is an application of the electrode connection structure shown in FIG. 3B, and FIG. 9B is an application of the electrode connection structure shown in FIG. 6B.

That is, processing both front and back surfaces of the longitudinal side surface of the lead 11 makes it possible to stack the semiconductor chip and/or the substrate in multiple layers using the electrode connection structure according to each embodiment described above.

In each embodiment described above, the plated connection is preferably made by plating with a metal or an alloy having a melting point of 700° C. or higher, and, in particular, the metal or the alloy is preferably nickel (Ni) or a nickel (Ni) alloy. This allows high quality to be maintained without damaging the connected portion even when it is used at a high temperature of about 300° C. or higher, for example. Further, using the nickel (Ni) or the nickel (Ni) alloy allows for plating treatment at a temperature of 100° C. or lower, resulting in that it is possible to eliminate damages to the semiconductor chip, the substrate, the lead frame and the like due to stress and heat during the plating treatment, thereby maintaining high quality.

Fourth Embodiment of the Present Invention

An electrode connection structure forming method according to the present embodiment will be described with reference to FIGS. 10A and 10B. The electrode connection structure forming method according to the present embodiment is such that the first connection surface 13 and the edge portion 15 on the second connection surface 14 are joined by ultrasonic vibration. Ultrasonic joining is used for joining of wire bonding, for example, and to perform the joining at the molecular level by reducing the distance between molecules while removing an unnecessary film (such as an oxide film) on the surface of a joining surface by ultrasonic vibration. Ultrasonic joining is extremely difficult in joining surfaces together, but can successfully join wire bonding and the edge portion 15 of the present invention to a plane electrode.

Figure 10A:
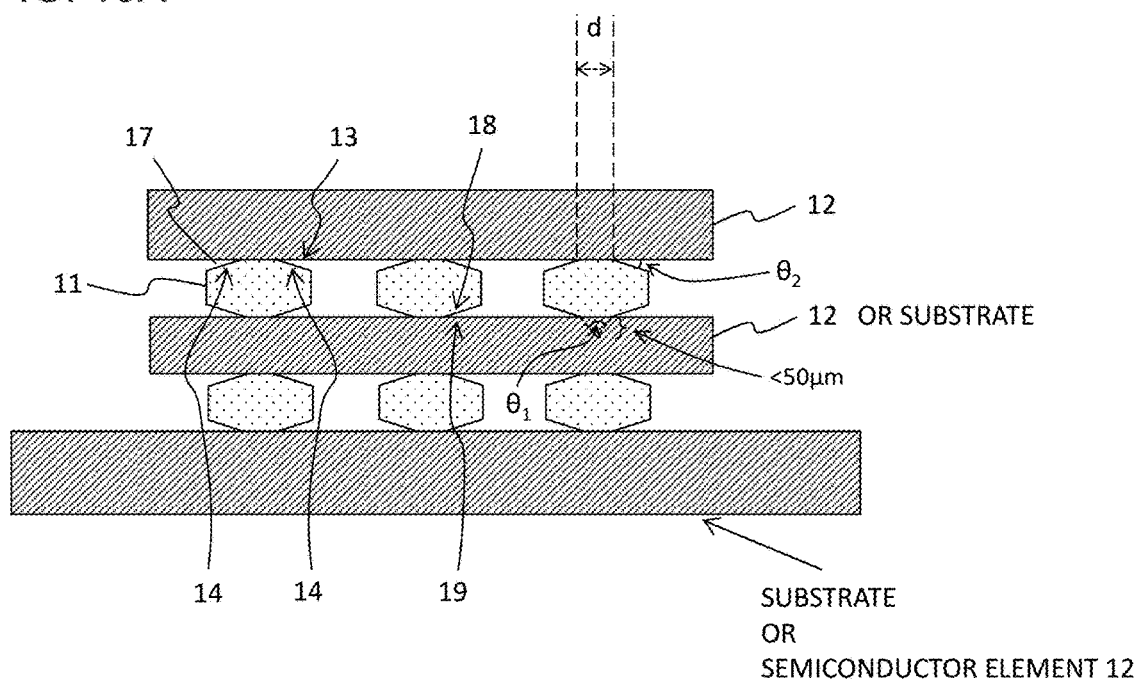
FIGS. 10A and 10B are diagrams showing an electrode connection structure forming method according to a fourth embodiment.
Figure 10B:
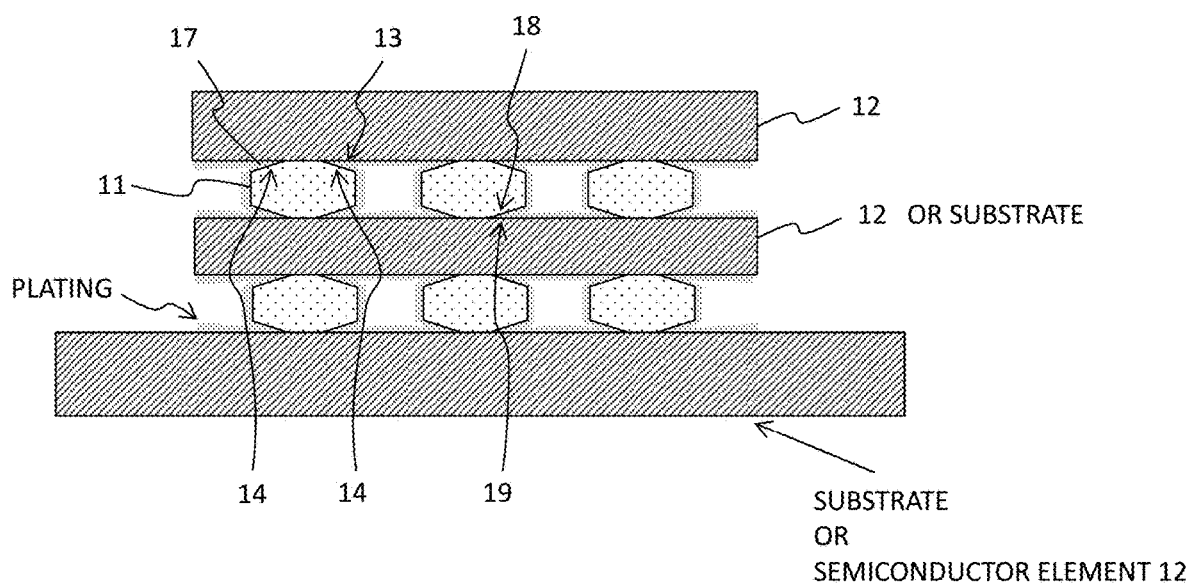

FIGS. 10A and 10B are diagrams showing how the above-described electrode connection structure is formed using ultrasonic joining. FIG. 10A is a diagram showing joining the first connection surface 13 and the second connection surface 14 together by ultrasonic joining and joining the third connection surface 18 and the fourth connection surface 19 together by ultrasonic joining. FIG. 10B is a diagram showing a case where plating treatment is performed in the state of FIG. 10A. That is, the semiconductor chip 12 and the leads 11 are temporarily joined by the ultrasonic joining as shown in FIG. 10A, and in this state the plating treatment shown in FIG. 10B is performed. Such a temporal joining by ultrasonic joining makes it possible to perform subsequent plating treatment with stability and high accuracy.

In FIG. 10A, vibration of a ultrasonic wave can be applied in a longitudinal direction or a width direction of the lead 11. Applying the vibration in the longitudinal direction, that is, in a direction where the edge portion extends on a line in a case of FIG. 10A, improves efficiency of destroying substances that inhibit joining, such as oxides on the surface of a joined surface, and makes it easy that the entire edge portion 15 deforms such that it comes into contact with the entire joined surface, so that it is possible to reduce damage to electrodes of the first connection surface 13 and the fourth connection surface 19. With respect to the frequency of the ultrasonic wave, when the frequency of the ultrasonic vibration to be applied is low, the edge portions 15a and 15b may deform before an oxide film is destroyed, resulting in that joining property may be inferior, and when the frequency of the ultrasonic vibration to be applied is high, attenuation of an energy during propagation may be large, resulting in that energy efficiency contributing to the joining may be lowered. Therefore, in the present embodiment, ultrasonic vibration is applied at a frequency of 15 to 150 kHz. This makes it possible to efficiently propagate energy while destroying the oxide film before the edge portions 15a and 15b deform.

Temperature at which ultrasonic joining is performed can be a room temperature, but it is desirable to be heated to about 180° C. or less at which oxidation hardly occurs. Further, it is effective to keep the atmosphere of a joining portion inactive by nitrogen gas or the like to suppress oxidation.

Furthermore, since ultrasonic joining has difficulty in joining surfaces as described above, it is desirable that the application time, the pressurization magnitude, and the energy of ultrasonic vibration are adjusted such that the buckling width d of the edge portions 15a and 15b is about 1 to 50 μm. Further, in order to facilitate deformed joining by ultrasonic vibration, tips of the edge portions 15a and 15b may be formed such that an angle $\theta_1$ of the tips (for example, from the top ends of the edge portions 15a and 15b to a position at about 50 μm therefrom) is an acute angle of $\theta_1 < 90°$.

The electrode connection structure as shown in FIG. 10B is formed by temporarily fixing the leads 11 and the semiconductor chip 12 with the above-described ultrasonic joining and by performing the plating treatment in this state.

As described above, the leads 11 and part or all of the semiconductor chip 12 electrode (or the substrate electrode) are temporarily fixed by ultrasonic joining, so that it is possible to easily perform the positioning of the plating joining and it is possible to reduce residual voids after plating in a non-contact region of the tip of the edge portion. Further, it is not needed to use an auxiliary jig when the positioning of the plating joining is performed, so that it is possible to omitting the step of attaching and detaching the jig and to realize a simple and low-cost manufacturing method.

In each embodiment described above, it is desirable that an angle between the first connection surface 13 and the second connection surface 14 and an angle $\theta_2$ between the third connection surface 18 and the fourth connection surface 19 (see FIG. 10A, for example) are 3 to 15 degrees. That is, when it is used as a power device, for example, a large amount of electric current is passed, so that it is necessary to improve thermal conductivity. For this purpose, it is necessary to increase the width of the electrode to some extent. If the angle between the respective connection surfaces exceeds 15 degrees, it is necessary to perform the plating treatment for a long time to increase the width of the electrode. This may deteriorate manufacturing efficiency. Setting the angle between the respective connection surfaces to about 3 to 15 degrees makes it possible to form the electrode with a large width in a short plating time, thereby reducing the plating time greatly and improving the manufacturing efficiency.

Further, the electrode connection structure and the electrode connection structure forming method using the ultrasonic joining in the present embodiment can be applied to the technology according to the above-described respective embodiments.

Examples

The following experiment was conducted on the electrode connection structure according to the present invention. FIG.

Figure 11B:
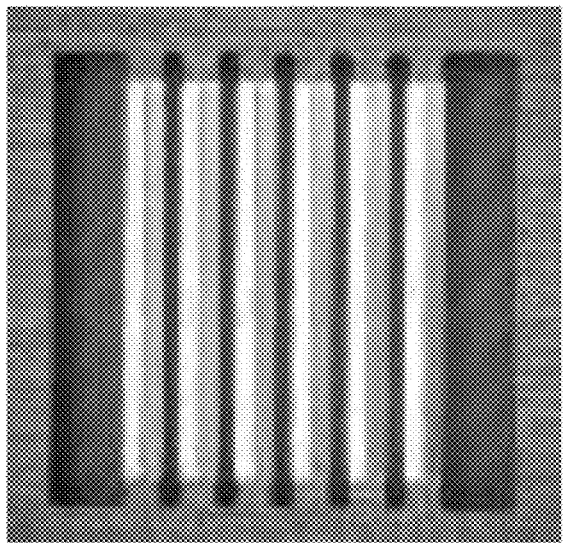
FIG. 11A is a diagram showing a cross sectional shape and FIG. 11B is a diagram showing an appearance of a lead frame used in Examples.

11A is a diagram showing a cross sectional shape and FIG. 11B is a diagram showing an appearance of the lead frame used in the present example. In the present example, the connection surface (=the second connection surface 14) of the longitudinal side surface of the lead 11 was chamfered to form a mountain shape, and the back surface side (=the third connection surface 18) thereof was made flat, as shown in FIGS. 11A and 11B.

Figure 11A:
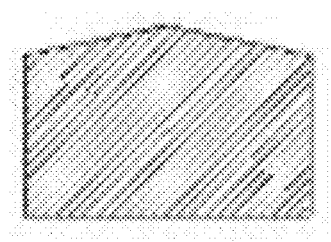
Figure 12A:
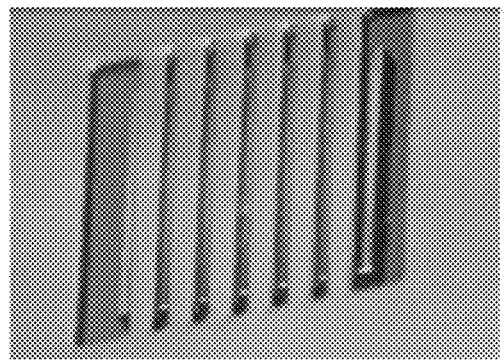
FIGS. 12A to 12C are diagrams showing a result of connecting the lead frame and the semiconductor chip electrode by nickel (Ni) plating.
Figure 12B:
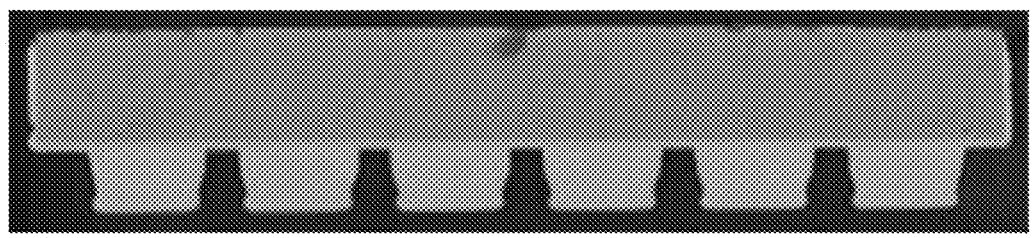
Figure 12C:
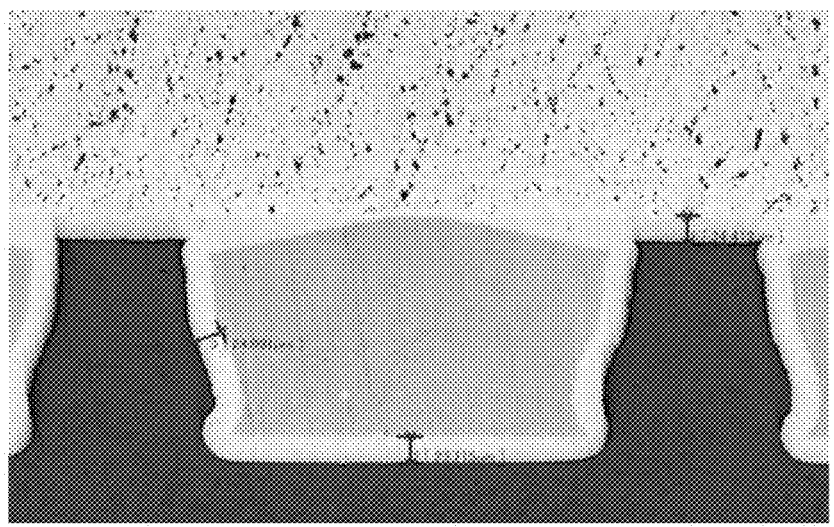

FIGS. 12A to 12C show a result of connecting the lead frame and the semiconductor chip 12 electrode of FIGS. 11A and 11B by nickel (Ni) plating. FIG. 12A is a photograph showing an appearance when the lead frame and the semiconductor chip were joined together, FIG. 12B is a photograph showing a joining cross section when the lead frame and the semiconductor chip were joined, and FIG. 12C is a photograph showing an enlarged view of a part of the joining cross section of FIG. 12B. As is clear from the photograph as shown in FIGS. 12A to 12C, it can be confirmed that the leads 11 and the semiconductor chip 12 electrode were connected by nickel (Ni) plating without causing defects such as voids. Further, it can be confirmed that nickel (Ni) plating was sufficiently filled from the edge portion 15 of the lead 11 to the outer portion 16 of the lead 11 and the plating connection with extremely high quality and high thermal conductivity could be realized.

As described above, it has been revealed that extremely high-quality plating connection is possible by the electrode connection structure according to the present invention. Enabling such high-quality plating connection makes it possible to directly join an interposer and a semiconductor chip, thereby realizing high heat resistance, high thermal conductivity, and low inductance. Further, heat treatment is unnecessary, so that the influence of residual stress and oxidation during the process can be suppressed, and high reliability can be realized by improving the mechanical strength by plating mounting. Furthermore, processes such as die bonding and wire bonding can be performed collectively in the plating process, so that it is possible to realize high productivity.

REFERENCE SIGNS LIST

10 Lead frame
11 Lead
12 Semiconductor chip
13 First connection surface
14 Second connection surface
15 (15a, 15b) Edge portion
16 (16a, 16b) Outer portion
17 (17a) Gap
18 Third connection surface
19 Fourth connection surface

The invention claimed is:

1. A lead frame connectable to an electrode of an electronic device or a substrate by plating, the lead frame comprising:
   a plurality of leads,
   wherein each of the leads:
      is elongated,
      is arranged in parallel with others of the leads,
      comprises a connection surface that is connected, by the plating, to the electrode in a manner that causes an edge portion of the connection surface to be in direct physical contact with the electrode, and
      is reduced in thickness continuously from the edge portion toward
         (1) an outer portion of the connection surface in a width direction of the leads, or
         (2) a center portion between the edge portion and another edge portion adjacent to the edge portion in a longitudinal direction of the leads.

2. The lead frame according to claim 1, wherein:
the edge portion is formed at a center portion of the connection surface in a longitudinal direction.

3. The lead frame according to claim 1, wherein:
the edge portion comprises a plurality of transverse edge portions that are formed at a predetermined interval in a transverse direction of the connection surface, and a transverse concave groove-like gap is formed between each pair of adjacent transverse edge portions, the transverse gap penetrating in a transverse direction of the connection surface, wherein each of the leads is reduced in thickness from one of the pair of the adjacent transverse edge portions toward the center portion between the pair of the adjacent transverse edge portions.

4. The lead frame according to claim 1, wherein:
a longitudinal concave groove-like gap that is continuous or discontinuous in a longitudinal direction of the connection surface is formed.

5. The lead frame according to claim 1, wherein:
another edge portion is formed on a back surface side opposite to the connection surface.

6. The lead frame according to claim 1, wherein:
the edge portion is formed at an angle of 3 to 15 degrees with respect to a surface of the electrode configured to be joined to the edge portion.

* * * * *